United States Patent
Park (10) Patent No.: US 9,825,110 B2
(45) Date of Patent: Nov. 21, 2017

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin (KR)

(72) Inventor: Joung-Keun Park, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/693,397

(22) Filed: Apr. 22, 2015

(65) Prior Publication Data

US 2016/0087017 A1 Mar. 24, 2016

(30) Foreign Application Priority Data

Sep. 19, 2014 (KR) .................. 10-2014-0124827

(51) Int. Cl.
 *H01L 27/32* (2006.01)
 *H01L 51/52* (2006.01)
 *H01L 51/50* (2006.01)

(52) U.S. Cl.
 CPC ...... *H01L 27/3258* (2013.01); *H01L 51/5056* (2013.01); *H01L 51/52* (2013.01); *H01L 51/5253* (2013.01); *H01L 51/5262* (2013.01)

(58) Field of Classification Search
 CPC combination set(s) only.
 See application file for complete search history.

(56) References Cited

U.S. PATENT DOCUMENTS

| 2012/0074435 A1* | 3/2012 | Ha | H01L 51/5203 257/88 |
| 2013/0001603 A1* | 1/2013 | Lim | H01L 51/5209 257/88 |
| 2014/0097407 A1* | 4/2014 | Oh | H01L 51/5203 257/40 |

FOREIGN PATENT DOCUMENTS

| KR | 10-2011-0132816 | 12/2011 |
| KR | 10-2012-0035039 | 4/2012 |
| KR | 10-2013-0044672 | 5/2013 |
| KR | 10-2014-0046553 | 4/2014 |

* cited by examiner

*Primary Examiner* — Kyoung Lee
*Assistant Examiner* — Ratisha Mehta
(74) *Attorney, Agent, or Firm* — H.C. Park & Associates, PLC (57) ABSTRACT

An organic light emitting display device including a substrate, a semiconductor device disposed on the substrate, an insulation layer including an inclined structure disposed on the semiconductor device, a first electrode disposed on the insulation layer, a pixel defining layer disposed on the insulation layer and the first electrode, the pixel defining layer having a pixel opening exposing the first electrode positioned on the inclined structure, an organic light emitting layer disposed on the exposed first electrode and the pixel defining layer, and a second electrode disposed on the organic light emitting layer and the pixel defining layer. Light generated from the organic light emitting layer may be directed in different directions by the inclined structure.

16 Claims, 11 Drawing Sheets

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION

This application claims priority from and the benefit of Korean Patent Application No. 10-2014-0124827, filed on Sep. 19, 2014, which is hereby incorporated by reference for all purposes as if fully set forth herein

BACKGROUND

Field

Exemplary embodiments relate to organic light emitting display devices and method of manufacturing organic light emitting display devices. More particularly, exemplary embodiments relate to organic light emitting display devices including insulation layers having inclined structures, and method of manufacturing organic light emitting display devices including insulation layers having inclined structures.

Discussion of the Background

A transparent organic light emitting display device can transmit an image of an object from in front or behind a transparent region of the organic light emitting display device when the organic light emitting display device operates in an "OFF" state. In an "OFF" state, the organic light emitting display device may display an image in a pixel region adjacent to the transparent region using a light generated from an organic light emitting layer thereof.

In a conventional transparent organic light emitting display device, the transparent region may be reduced when the area of the pixel region is increased so as to improve the resolution of the image. Thus, the conventional transparent organic light emitting display device may have reduced transmittance. In case that the area of the transparent region is increased, the resolution of the image may be deteriorated although the transmittance can be improved. Therefore, it would be beneficial to have a transparent organic light emitting display device having enhanced transmittance in a transparent region while ensuring desired resolution in a pixel region.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display device including an insulation layer having an inclined structure and symmetrically arranged transparent regions so as to have improved transmittance and high resolution.

Exemplary embodiments also provide a method of manufacturing an organic light emitting display device including an insulation layer having an inclined structure and symmetrically arranged transparent regions so as to have improved transmittance and high resolution.

Additional aspects will be set forth in the detailed description which follows, and, in part, will be apparent from the disclosure, or may be learned by practice of the inventive concept.

An exemplary embodiment of the present invention discloses an organic light emitting display device that includes a substrate having a pixel region and a transparent region, a semiconductor device disposed on the substrate, an insulation layer having an inclined structure disposed on the semiconductor device, a first electrode disposed on the insulation layer, a pixel defining layer disposed on the insulation layer and the first electrode, an organic light emitting layer disposed on the exposed first electrode and the pixel defining layer, and a second electrode disposed on the organic light emitting layer and the pixel defining layer. The pixel defining layer may have a pixel opening exposing the first electrode positioned on the inclined structure. Light generated from the organic light emitting layer may be directed in different directions by the inclined structure.

An exemplary embodiment of the present invention also discloses a method of manufacturing an organic light emitting display device. In the method, a substrate having a pixel region and a transparent region may be provided, and then a semiconductor device may be formed on the substrate. An insulation layer including an inclined structure may be formed on the semiconductor device. After forming first electrode on the insulation layer, a pixel defining layer may be formed on the insulation layer and the first electrode. The pixel defining layer may have a pixel opening exposing the first electrode positioned on the inclined structure. An organic light emitting layer may be formed on the exposed first electrode and the pixel defining layer. A second electrode may be formed on the organic light emitting layer and the pixel defining layer. Lights generated from the organic light emitting layer may proceed in different directions by the inclined structure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
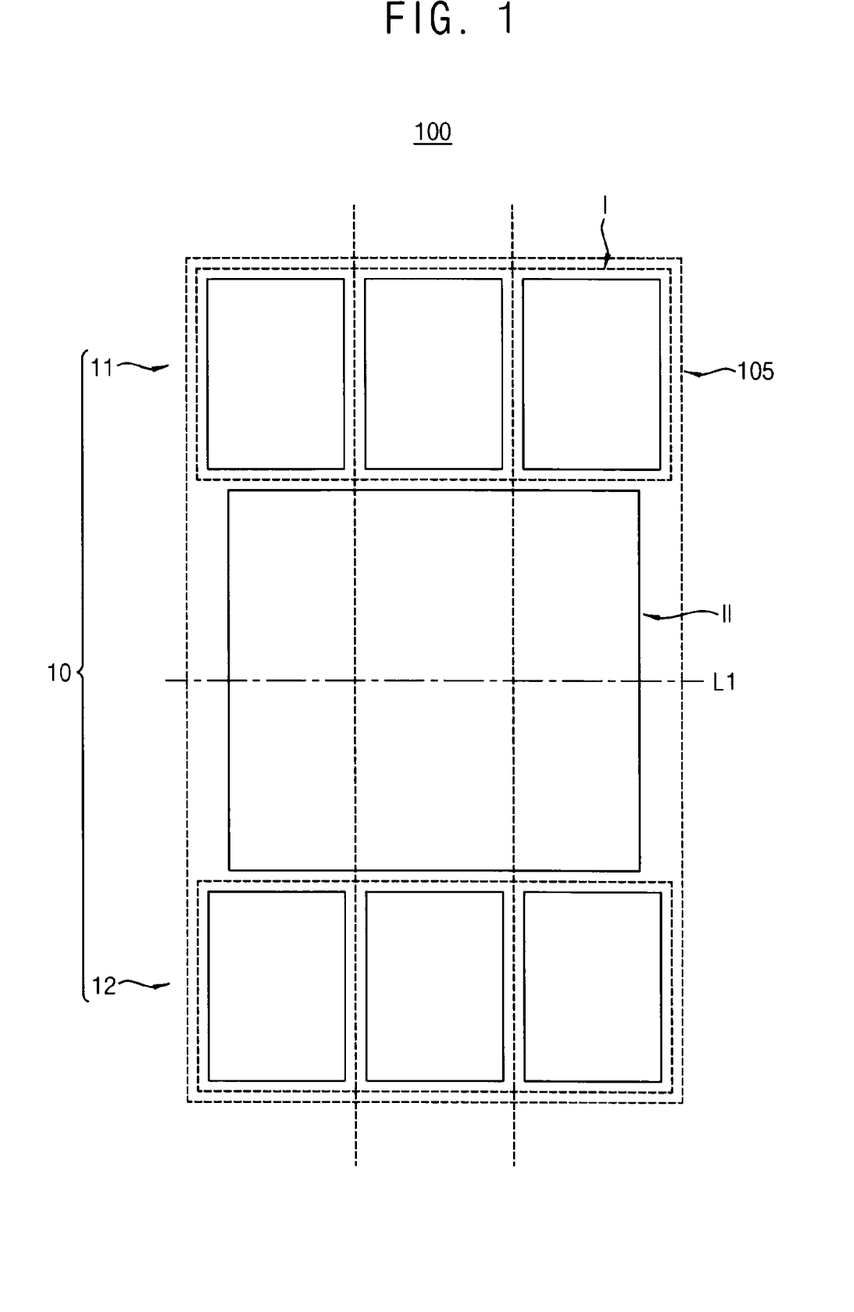
FIG. 1 is a plan sectional view illustrating an organic light emitting display device in accordance with exemplary embodiments.
Figure 2:
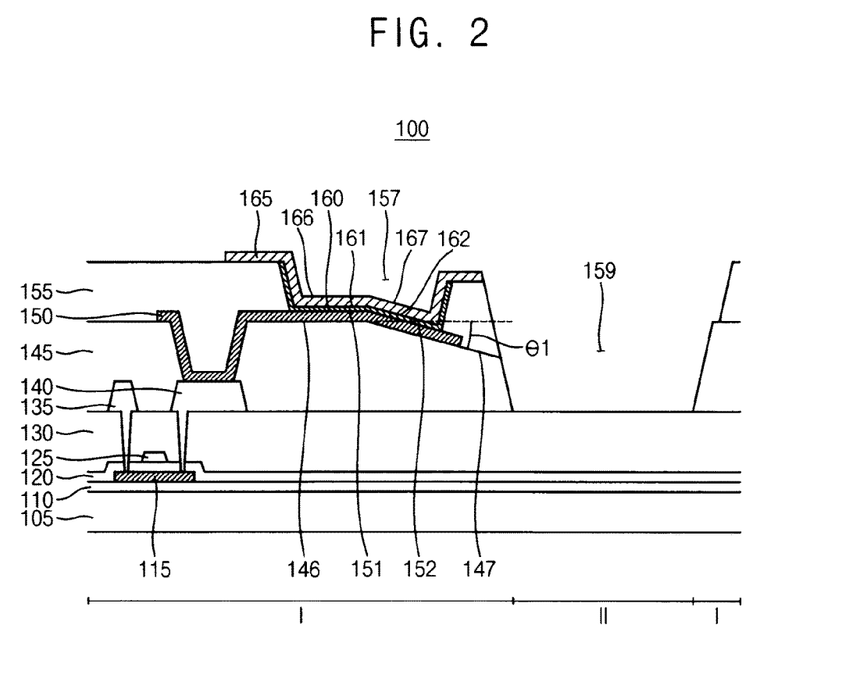
FIG. 2 is a cross sectional view illustrating an organic light emitting display device in accordance with exemplary embodiments.
Figure 3:
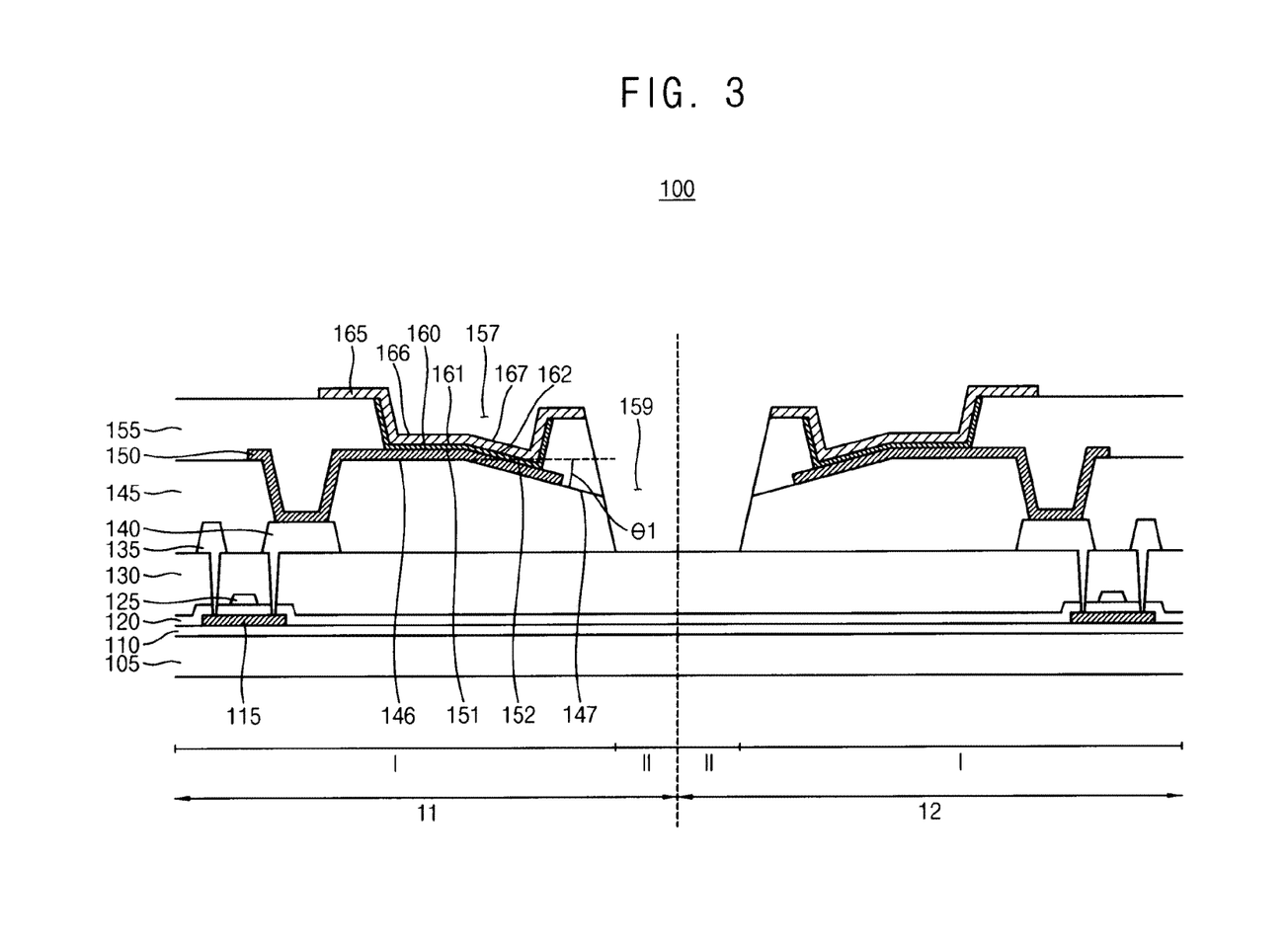
FIG. 3 is a cross sectional view illustrating adjacent pixels of an organic light emitting display device in accordance with exemplary embodiments.

FIG. 1 is a plan sectional view illustrating an organic light emitting display device in accordance with exemplary embodiments. FIG. 2 is a cross sectional view illustrating an organic light emitting display device in accordance with exemplary embodiments. FIG. 3 is a cross sectional view illustrating adjacent pixels of an organic light emitting display device in accordance with exemplary embodiments.

Referring to FIG. 1, FIG. 2, and FIG. 3, an organic light emitting display device 100 may include a substrate 105, a semiconductor device, an insulation layer 145, a first electrode 150, a pixel defining layer 155, an organic light emitting layer 160, a second electrode 165, etc.

A plurality of pixels 10 may be arranged on the substrate 105. Each of the pixels 10 may have a pixel region I and a transparent region II. In exemplary embodiments, the transparent regions II of adjacent pixel 11 and 12 regions I may be combined, as illustrated in FIG. 3. In other words, the transparent region II of one pixel 11 and the transparent region II of adjacent another pixel 12 may be symmetrically disposed centering a reference line L1. Because of such combined transparent regions II, the organic light emitting display device 100 may include an entire transparent region II having an increased area by about 20%, so that the organic light emitting display device 100 may have improved transmittance.

A buffer layer 110 may be disposed on the substrate 105. The buffer layer 110 may include silicon oxide and/or silicon nitride. The buffer layer 110 may prevent the diffusion of impurities or metal ions from the substrate 105. Additionally, the buffer layer 110 may improve the flatness of the substrate 105. However, the buffer layer 110 may be omitted in accordance with the ingredients included in the substrate 105.

The semiconductor device may be disposed on the substrate 105 or the buffer layer 110. The semiconductor device may include a thin film transistor, an oxide semiconductor device, or the like. This semiconductor device may include an active pattern 115, a gate insulation layer 120, a gate electrode 125, an insulating interlayer 130, a source electrode 135, and a drain electrode 140. In an example embodiment, the organic light emitting display device 100 may have improved transmittance when the semiconductor device is an oxide semiconductor device.

The insulation layer 145 may be disposed on the substrate 105 to substantially cover the semiconductor device. The insulation layer 145 may have an inclined structure, as illustrated in FIG. 2 and FIG. 3. Because of this inclined structure of the insulation layer 145, light generated from the organic light emitting layer 160 may be emitted in different directions, respectively. In exemplary embodiments, the inclined structure of the insulation layer 145 may include an upper face having different angles with respect to the substrate 105 in the pixel region I. Particularly, a first portion 146 of the upper face of the insulation layer 145 may be substantially in parallel to an upper surface of the substrate 105, and a second portion 147 of the upper surface of the insulation layer 145 may be downwardly inclined toward the upper surface of the substrate 105. For example, the second portion 147 of the upper face of the insulation layer 145 may have an inclination angle θ1 of about 30° to about 60° with respect to the upper surface of the substrate 105. The organic light emitting display device 100 may display an image with the highest resolution when the inclination angle θ1 of the second portion 147 is in a range between about 30° and about 60°. In this case, the organic light emitting display device 100 may be a top emission type organic light emitting display device.

When the organic light emitting display device 100 is of the top emission type, some of the light generated from the organic light emitting layer 160 may be directed into the transparent region II by the inclined structure of the insulation layer 145. Thus, a portion of the transparent region II of the organic light emitting display device 100 may serve as an extension of the pixel region I. That is, the organic light emitting display device 100 may display the image using the portion of the transparent region II as well as the pixel region I. An area of the portion of the transparent region II utilized the pixel region I may vary in accordance with the inclination angle θ1 of the second portion 147 of the upper face of the insulation layer 145. More specifically, as the inclination angle θ1 of the second portion 147 increases, the area of the portion of the transparent region II utilized as an extension of the pixel region I may also increase.

The insulation layer 145 may include an organic material. Examples of the organic material for the insulation layer 145 may include photoresist, acryl-based polymer, polyimide-based polymer, polyamide-based polymer, siloxane-based polymer, photosensitive polymer containing carboxyl groups, novolac resin, water-soluble alkali resin, and the like. These may be used alone or in a combination thereof. Alternatively, the insulation layer 145 may include an inorganic material. Examples of the inorganic material for the insulation layer 145 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), titanium oxide ($TiO_x$), magnesium oxide ($MgO_x$), zinc oxide ($ZnO_x$), hafnium oxide ($HfO_x$), tantalum oxide ($TaO_x$), zirconium oxide ($ZrO_x$), and the like. These may be used alone or in a combination thereof.

The insulation layer 145 may have a contact hole in the pixel region I and an opening 159 in the transparent region II. The contact hole may expose a portion of the drain electrode 140, and the opening 159 may partially expose the insulating interlayer 130. As the contact hole and the opening 159 are provided through the insulation layer 145, the pixel region I and the transparent region II of the organic light emitting display device 100 may be defined. Further, as described above, the organic light emitting display device 100 may utilize the portion of the transparent region II as an extension of the pixel region I, the transparent region II of one pixel 11 and the transparent region II of adjacent another pixel 12 may be combined without reducing the resolution of the image displayed by the organic light emitting display device 100. While light may diverge from the organic light emitting layer 160 in the different directions by the inclined structure, as illustrated in FIG. 2 and FIG. 3, the invention may not be limited thereto. For example, the insulating interlayer 130 may alternatively or additionally include an inclined structure having an inclination angle substantially the same as or similar to the above-described inclination angle θ1, so that the light emitted from the organic light emitting layer 160 may be sent in different directions by the inclined structure of the insulating interlayer 130.

The first electrode 150 may be disposed on the insulation layer 145. The first electrode 150 may extend onto the inclined structure of the insulation layer 145. Hence, a first portion 151 of the first electrode 150, which is disposed on the first portion 146 of the upper face of the insulation layer 145, may be substantially parallel to the upper surface of the substrate 105. Further, a second portion 152 of the first electrode 150, positioned on the second portion 147 of the upper face of the insulation layer 145, may be inclined downward by an angle substantially the same as the inclination angle θ1. The first electrode 150 may include a material having a reflectivity or a material having a transmittance according to the emission type of the organic light emitting display device 100. For example, when the organic light emitting display device 100 is of the top emission type, the first electrode 150 may include material having transmittance.

The pixel defining layer 155 may be disposed on the insulation layer 145 and the first electrode 150. In exemplary embodiments, the pixel defining layer 155 may include a pixel opening 157 partially exposing the first electrode 150 in the pixel region I. In this case, a first portion of a sidewall of the pixel opening 157 may have an inclination angle different from an inclination angle of a second portion of the sidewall of the pixel opening 157. The inclination angle of the first portion of the sidewall of the pixel opening 157 may be substantially greater than the inclination angle of the second portion of the sidewall of the pixel opening 157. For example, the inclination angle of the first portion of the sidewall of the pixel opening 157 may be in a range between about 100° and about 170°, and the inclination angle of the second portion of the sidewall of the pixel opening 157 may be in a range of about 90° to about 170°. Therefore, a ratio between the inclination angle of the first portion of the sidewall and the inclination angle of the second portion of the sidewall may be in a range of about 1.0:0.5 to about 1.0:1.7.

As illustrated in FIG. 2 and FIG. 3, the opening 159 may be provided through the pixel defining layer 155 and the insulation layer 145 in the transparent region II. The opening 159 may expose a portion of the insulating interlayer 130 in the transparent region II. With the formation of the opening 159 through the pixel defining layer 155 and the insulation layer 145, the pixel and the transparent regions I and II may be completely defined. Here, the pixel opening 157 of the pixel defining layer 155 may be located in the pixel region I. When the opening 159 is provided in the transparent region II, the organic light emitting display device 100 may have improved transmittance of incident light from than that of a conventional organic light emitting display device having no opening in a transparent region thereof. Moreover, the opening 159 may be symmetrically disposed between adjacent pixels 11 and 12, such that the organic light emitting display device 100 may have considerably increased transmittance in comparison with a conventional organic light emitting display device.

The organic light emitting layer 160 may be disposed on the pixel defining layer 155 and the first electrode 150. In exemplary embodiments, the organic light emitting layer 160 may extend onto the first portions of the sidewall of the pixel opening 157. Accordingly, a first portion 161 of the organic light emitting layer 160 positioned on the first portion 151 of the first electrode 150 may be substantially parallel to the upper surface of the substrate 105, and a second portion 162 of the organic light emitting layer 160 positioned on the second portion 152 of the first electrode 150 may have an inclination angle relative to the upper surface of the substrate 105. Here, the second portion 162 of the organic light emitting layer 160 may have the inclination angle substantially the same as the inclination angle θ1 of the second portion 147 of the upper face of the insulation layer 145. Further, a sidewall of the organic light emitting layer 160 may be inclined in accordance with the sidewall of the pixel opening 157. According to exemplary embodiments, some of the light may be emitted from the organic light emitting layer 160 normal to the inclination angle θ1 of the second portion 147 of the upper face of the insulation layer 145, and then may proceed into the transparent region II. As a result, the organic light emitting display device 100 have high resolution because a portion of the transparent region II can be utilized as an extension of the pixel region I without reducing the transmittance of the organic light emitting display device 100.

The second electrode 165 may be disposed on the organic light emitting layer 160 and the pixel defining layer 155 in the pixel region I. Similarly, a first portion 166 of the second electrode 165 located on the first portion 161 of the organic light emitting layer 160 may be substantially parallel to the upper surface of the substrate 105, and a second portion 167 of the second electrode 165 positioned on the second portion 162 of the organic light emitting layer 160 may have an inclination angle relative to the upper surface of the substrate 105, which may be substantially the same as the inclination angle θ1 of the second portion 147 of the upper face of the insulation layer 145. Additionally, portions of the second electrode 165 on the sidewall of the pixel opening 157 may have inclination angles substantially the same as the inclination angles of the first and the second portions of the sidewall of the pixel opening 157. The second electrode 165 may include a material substantially the same as that included in the first electrode 150. In an example embodiment, the second electrode 165 may include a material having a transmittance when the organic light emitting display device 100 is of the top emission type. Alternatively, the second electrode 165 may include a material having a reflectivity when the organic light emitting display device 100 is of the bottom emission type.

The conventional transparent organic light emitting display device may not have the desired transmittance because the area of the transparent region decreases when the area of the pixel region increases so as to improve the resolution of the image. Additionally, the resolution of the image may deteriorate when the area of the transparent region is augmented in order to improve the transmittance. Moreover, although the transparent regions of adjacent pixels may be continuously arranged to increase the area of the entire transparent region, adjacent pixel regions may be separated by the widths of two transparent regions. As such, a user may recognize about 50 percent of the entire area of the adjacent pixels. The organic light emitting display device 100 in accordance with exemplary embodiments may include the openings 159 of the transparent regions II of the adjacent pixels 11 and 12 substantially symmetrically disposed each other, such that the entire area of the transparent regions II is increased relative to that of a conventional organic light emitting display device. Moreover, because some of the light emitted from the organic light emitting layer 160 may be directed toward the transparent region II by the insulation layer 145 having the inclined structure, the resolution of the image displayed by the organic light emitting display device 100 may be improved even though the transparent regions II of the adjacent pixels 11 and 12 may be continuously arranged.

Figure 4:
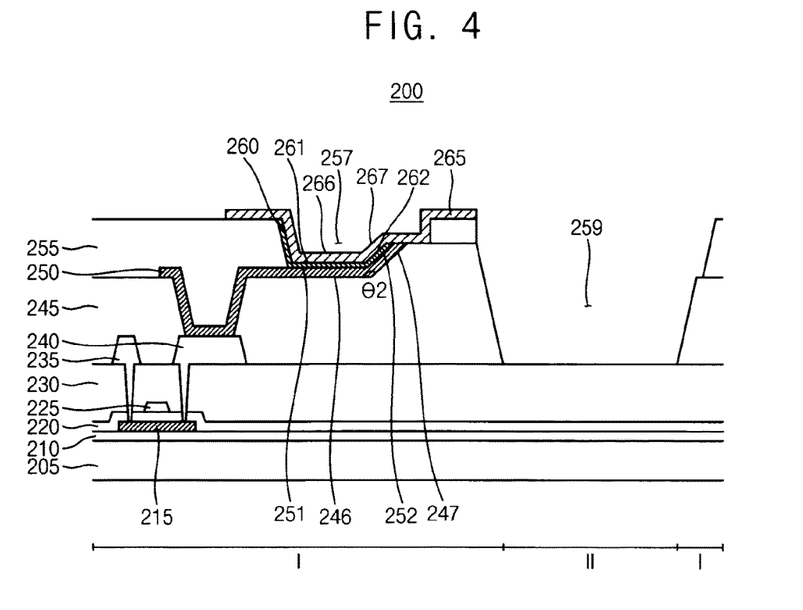
FIG. 4 is a cross sectional view illustrating an organic light emitting display device in accordance with some exemplary embodiments.

FIG. 4 is a cross sectional view illustrating an organic light emitting display device in accordance with further exemplary embodiments. An organic light emitting display device 200 illustrated in FIG. 4 may have a configuration substantially the same as that of the organic light emitting display device 100 described with reference to FIG. 1, FIG. 2, and FIG. 3, except for the insulation layer 245.

Referring to FIG. 4, the organic light emitting display device 200 may include a substrate 205, a semiconductor device, the insulation layer 245, a first electrode 250, a pixel defining layer 255, an organic light emitting layer 260, a second electrode 265, etc.

A buffer layer 210 may be disposed on the substrate 205, and the semiconductor device may be provided on the buffer layer 210. Alternatively, the semiconductor device may be provided directly on the substrate 205 when the buffer layer 210 may be omitted as described above. The semiconductor device may include an active pattern 215, a gate insulation layer 220, a gate electrode 225, an insulating interlayer 230, a source electrode 235, and a drain electrode 240.

The insulation layer 245 may be disposed on the insulating interlayer 230 to cover the source and the drain electrodes 235 and 240. The insulation layer 245 may include an inclined structure that may have portions inclined with respect to an upper surface of the substrate 205. Particularly, the inclined structure may include a first portion 246 of an upper face of the insulation layer 245 and a second portion 247 of the upper face of the insulation layer 245. The first portion 246 of the upper face may be substantially parallel to the upper surface of the substrate 205, and the second portion 247 of the upper face may be upwardly inclined away from the substrate 205. For example, the second portion 247 of the upper face of the insulation layer 245 may have an inclination angle θ2 of about 120° to about 150° relative to the upper surface of the substrate 205 (and relative to the first portion 246 that is parallel thereto). When the organic light emitting display device 200 is of a bottom emission type, some of light emitted from the organic light emitting layer 260 may be directed toward the transparent region II, so that the organic light emitting display device 200 may have improved resolution while increasing the transmittance of the organic light emitting display device 200.

FIG. 5, FIG. 6, FIG. 7, FIG. 8, FIG. 9, FIG. 10, and FIG. 11 are cross sectional views illustrating a method of manufacturing an organic light emitting display device in accordance with exemplary embodiments. The method illustrated in FIGS. 5 to 11 may provide an organic light emitting display device having a configuration substantially the same as or similar to that of the organic light emitting display device 100 described with reference to FIGS. 1 to 3, however, the organic light emitting display device 200 may also be manufactured by modifying or changing the processes of the method in FIGS. 5 to 11.

Figure 5:
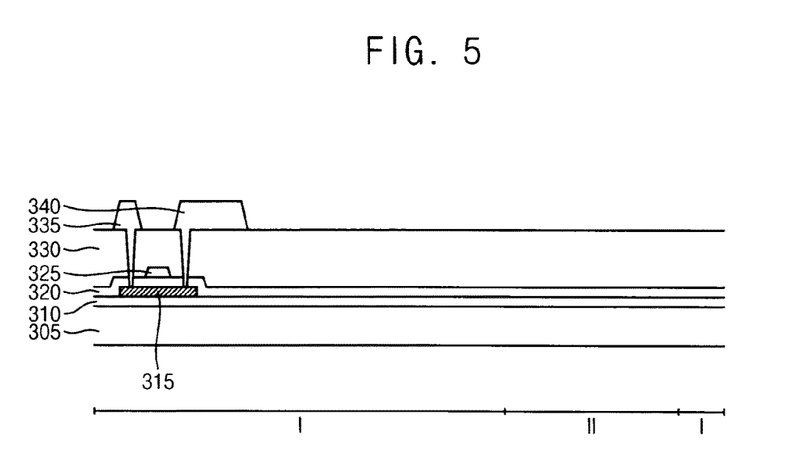
FIG. 5, FIG. 6, FIG. 7, FIG. 8, FIG. 9, FIG. 10, and FIG. 11 are cross sectional views illustrating a method of manufacturing an organic light emitting display device in accordance with exemplary embodiments.

Referring to FIG. 5, a substrate 305 having a pixel region I and a transparent region II may be provided. A buffer layer 310 then may be formed on the substrate 305. The buffer layer 310 may be formed using silicon oxide and/or silicon nitride. In some exemplary embodiments, the buffer layer 310 may be omitted depending on the ingredients included in the substrate 305.

A semiconductor device may be formed on the buffer layer 310 or may be directly formed on the substrate 305. In the formation of the semiconductor device, an active pattern 315 may be formed on the buffer layer 310 or the substrate 305, and then a gate insulation layer 320 may be formed on the buffer layer 310 or the substrate 305 to cover the active pattern 315. A gate electrode 325 may be formed on a portion of the gate insulation layer 320 over the active pattern 315. An insulating interlayer 330 may be formed on the gate insulation layer 320 to cover the gate electrode 325. A source electrode 335 and a drain electrode 340 may be formed through the insulating interlayer 330 and the gate insulation layer 320 to thereby contact a source region and a drain region of the active pattern 315, respectively.

Figure 6:
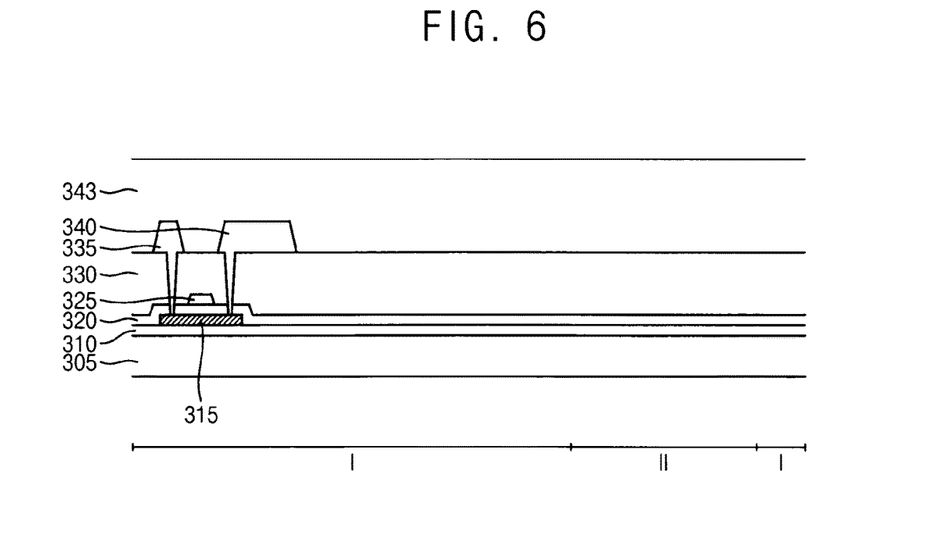

Referring to FIG. 6, a preliminary insulation layer 343 may be formed on the substrate 305 to substantially cover the semiconductor device. The preliminary insulation layer 343 may be formed using an organic material, for example, photoresist, acryl-based polymer, polyimide-based polymer, polyamide-based polymer, siloxane-based polymer, photosensitive polymer containing carboxyl groups, novolac resin, water-soluble alkali resin, and the like. Alternatively, the preliminary insulation layer 343 may be formed using an inorganic material, for example, silicon oxide, silicon nitride, silicon oxynitride, silicon oxycarbide, silicon carbonnitride, aluminum oxide, titanium oxide, magnesium oxide, zinc oxide, hafnium oxide, tantalum oxide, zirconium oxide, or the like. The preliminary insulation layer 343 may be formed by any suitable process, including but not limited to a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, or a vacuum evaporation process in accordance with the ingredients included in the preliminary insulation layer 343.

Figure 7:
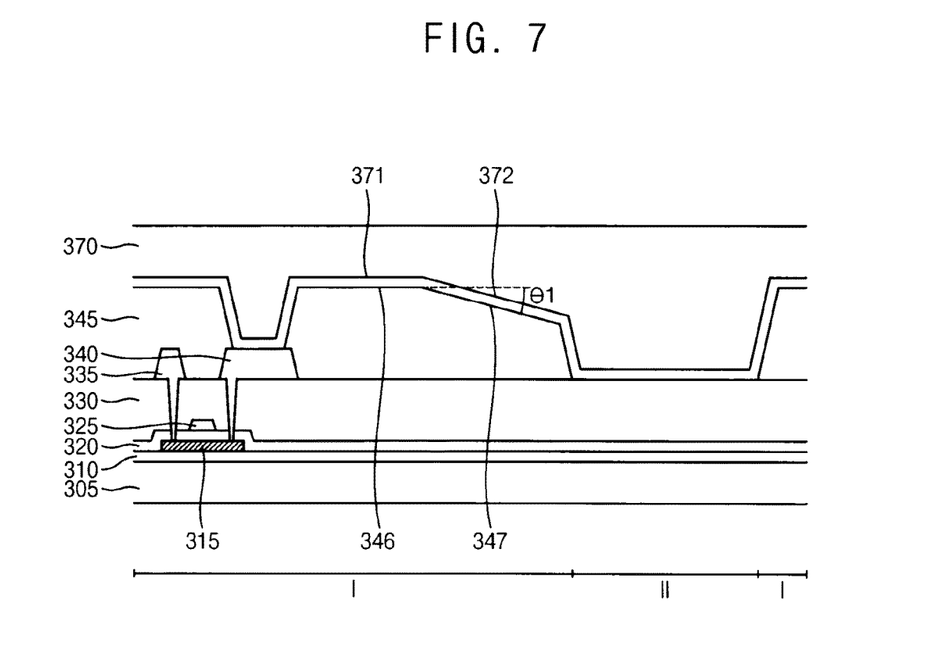

Referring to FIG. 7, the preliminary insulation layer 343 may be pressed using a mold 370 for forming an insulation layer 345 having an inclined structure. For example, the mold 370 may have a profile substantially opposed to the inclined structure of the insulation layer 345. Then, the preliminary insulation layer 343 may be cured to complete the insulation layer 345 including the inclined structure. For example, the preliminary insulation layer 343 may be cured by a thermal treatment and/or ultra violet (UV) rays. The inclined structure may include an upper face of the insulation layer 345. A first portion 346 of the upper face may be substantially parallel to an upper surface of the substrate 305 whereas a second portion 347 of the upper face may be downwardly inclined toward the substrate 305 by a predetermined inclination angle θ1. For example, this inclination angle θ1 may be in a range of about 30° to about 60° relative to the upper surface of the substrate 305 (or a first portion 346 substantially parallel thereto).

In exemplary embodiments, the mold 370 may have a configuration substantially opposed to that of the insulation layer 345 having the inclined structure. For example, the mold 370 may have a first pressing face 371 and a second pressing face 372 corresponding to the first portion 346 and the second portion 347 of the upper face of the insulation layer 345. Further, while forming the inclined structure of the insulation layer 345 using the mold 370, a preliminary opening may be formed in the transparent region II and a contact hole may be formed in the pixel region I. The contact hole may expose a portion of the drain electrode 340, and the preliminary opening may partially expose the insulation layer 345. In some exemplary embodiments, the contact hole and the preliminary opening may be formed after forming the inclined structure of the insulation layer 345. In other exemplary embodiments, the preliminary opening may be formed by partially removing a pixel defining layer 355 (see FIG. 9) and the insulation layer 345 while forming the pixel defining layer 355.

Figure 8:
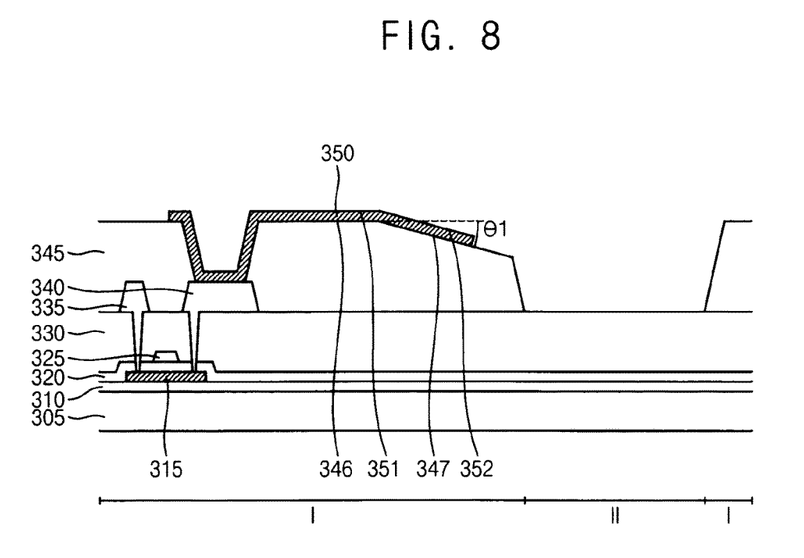

Referring to FIG. 8, a first electrode 350 may be formed on the insulation layer 345 having the inclined structure. The first electrode 350 may be formed using a material having transmittance or reflectivity in accordance with the emission type of the organic light emitting display device. The first electrode 350 may be formed on the insulation layer 345 along the profile of the inclined structure. Thus, a first portion 351 of the first electrode 350 formed on the first portion 346 of the upper face may be substantially parallel to the upper surface of the substrate 305, and a second portion 352 of the first electrode 350 formed on the second portion 347 of the upper face may be inclined relative to the substrate 305 by an inclination angle substantially the same as the inclination angle θ1 of the second portion 347 of the upper face of the insulation layer 345.

Figure 9:
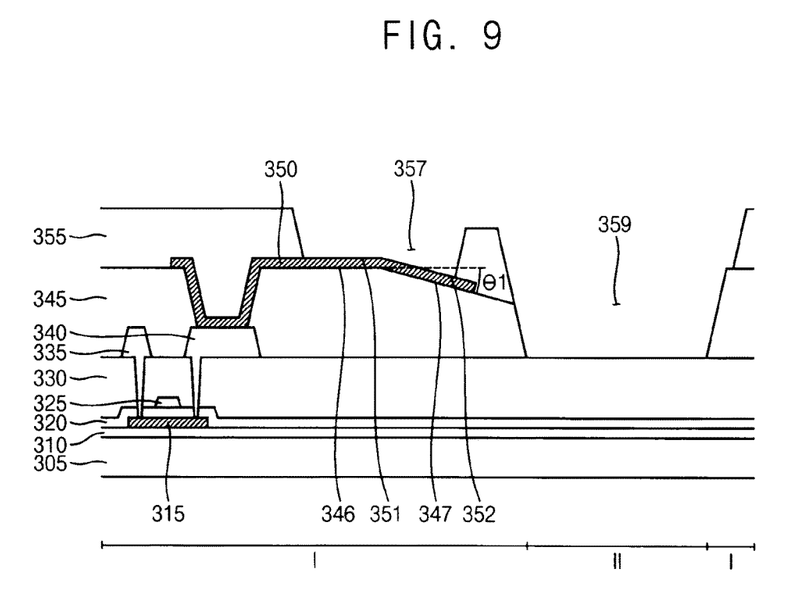

Referring to FIG. 9, the pixel defining layer 355 may be formed on the insulation layer 345 and the first electrode 350. The pixel defining layer 355 may be formed using an organic material having a relatively high transmittance, for example, polyimide-based polymer, polyamide-based polymer, and the like. The pixel defining layer 355 may be partially removed to form a pixel opening 357 in the pixel region I and to form an opening 359 in the transparent region II. The pixel opening 357 may expose a portion of the first electrode 350, and the opening 359 may pass through the pixel defining layer 355 and the insulation layer 345 to expose a portion of the insulating interlayer 330. Here, a sidewall of the pixel opening 357 may include a first portion and a second portion having different inclination angles, respectively, as described above.

Figure 10:
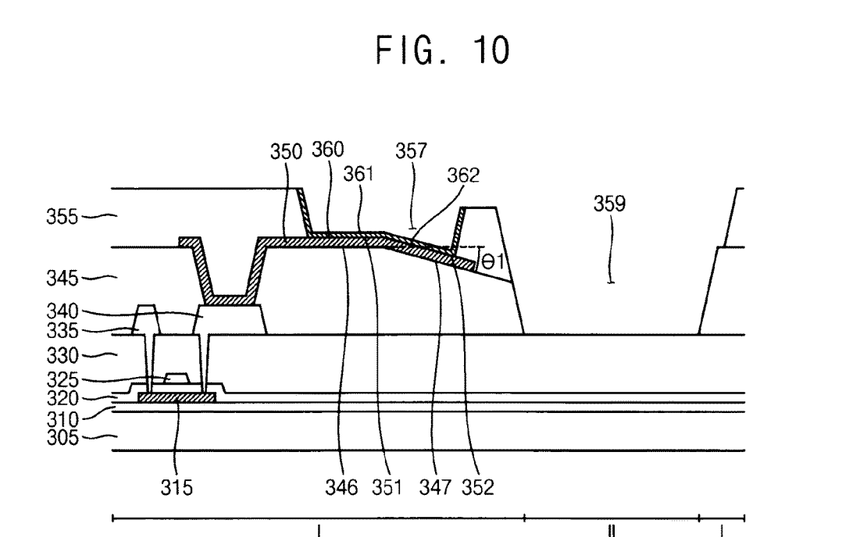

Referring to FIG. 10, an organic light emitting layer 360 may be formed on the exposed portion of the first electrode 350 and the pixel defining layer 355. The organic light emitting layer 360 may be formed over the sidewall of the pixel opening 357 along the first electrode 350. Hence, a first portion 361 of the organic light emitting layer 360 formed on the first portion 351 of the first electrode 350 may be substantially parallel to the upper surface of the substrate 305. Additionally, a second portion 362 of the organic light emitting layer 360 formed on the second portion 352 of the first electrode 350 may have an inclination angle θ1 with respect to the substrate 305, which may be substantially the same as that of the second portion 347 of the upper face of the insulation layer 345. Moreover, portions of the organic light emitting layer 360 formed on the sidewall of the pixel opening 357 may have different inclination angles in accordance with the first and the second portions of the sidewall of the pixel opening 357. Accordingly, some of the light generated from the organic light emitting layer 360 may be directed toward a portion of the transparent region II by the inclined structure of the insulation layer 345, and other light emitted from the organic light emitting layer 360 may be directed toward the front of the organic light emitting display device. Therefore, the organic light emitting display device may increase the resolution of the image by utilizing the light directed into the transparent region II while maintaining the desired transmittance thereof.

Figure 11:
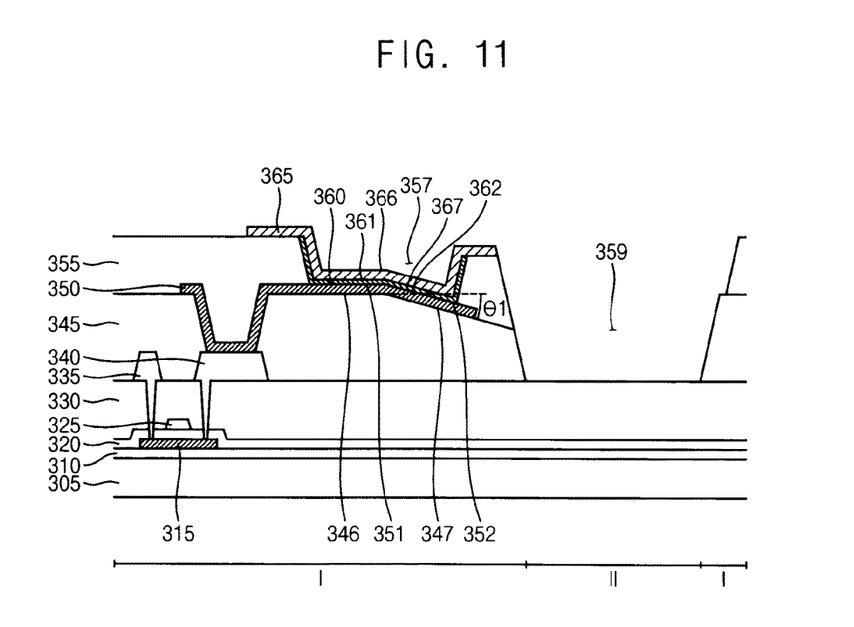

Referring to FIG. 11, a second electrode 365 may be formed on the organic light emitting layer 360 and the pixel defining layer 355. The second electrode 365 may also be formed using a material having a transmittance or a reflectivity in accordance with the emission type of the organic light emitting display device. A portion 366 of the second electrode 365 may be substantially parallel to the substrate 305 and another portion 367 may be inclined about the substrate 305 as described above. Further, portions of the second electrode 365 formed on the sidewall of the pixel opening 357 may have inclination angles different from each other.

FIG. 12, FIG. 13, FIG. 14, FIG. 15, FIG. 16, FIG. 17, and FIG. 18 are cross sectional views illustrating a method of manufacturing an organic light emitting display device in accordance with exemplary embodiments. In the method illustrated in FIGS. 12 to 18, an organic light emitting display device having a configuration substantially the same as or similar to that of the organic light emitting display device 100 described with reference to FIGS. 1 to 3 can be manufactured. Similarly, the organic light emitting display device 200 may be manufactured by modifying or changing the processes of the method in FIGS. 5 to 11.

Figure 12:
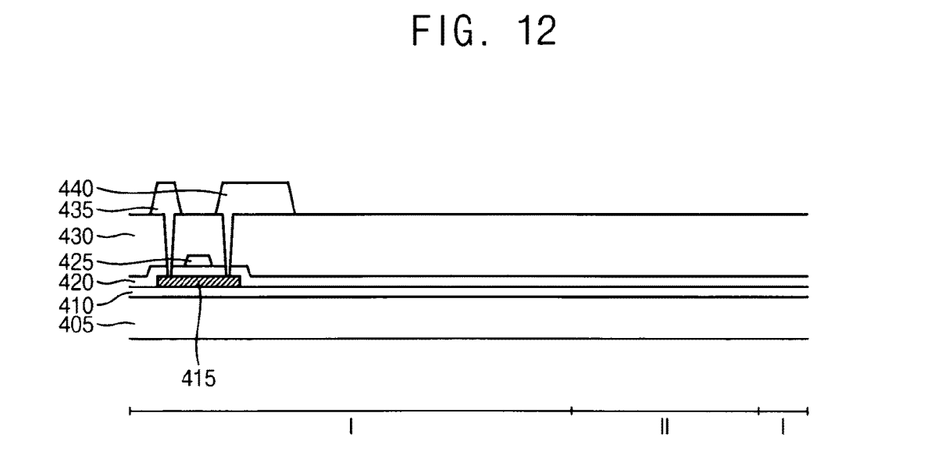
FIG. 12, FIG. 13, FIG. 14, FIG. 15, FIG. 16, FIG. 17, and FIG. 18 are cross sectional views illustrating a method of manufacturing an organic light emitting display device in accordance with exemplary embodiments.

Referring to FIG. 12, a semiconductor device may be formed on a substrate 405 including a pixel region I and a transparent region II. In some exemplary embodiments, the semiconductor device may include an oxide semiconductor device having an active pattern composed of oxide semiconductor. Alternatively, the semiconductor device may be formed to have a configuration substantially the same as that of the semiconductor device described with reference to FIG. 5. In the formation of the semiconductor device, an active pattern 415 may be formed on the buffer layer 410 or the substrate 405, and then a gate insulation layer 420 may be formed on the buffer layer 410 or the substrate 405 to cover the active pattern 415. A gate electrode 425 may be formed on a portion of the gate insulation layer 420 over the active pattern 415. An insulating interlayer 430 may be formed on the gate insulation layer 420 to cover the gate electrode 425. A source electrode 435 and a drain electrode 440 may be formed through the insulating interlayer 430 and the gate insulation layer 420 to thereby contact a source region and a drain region of the active pattern 415, respectively.

Figure 13:
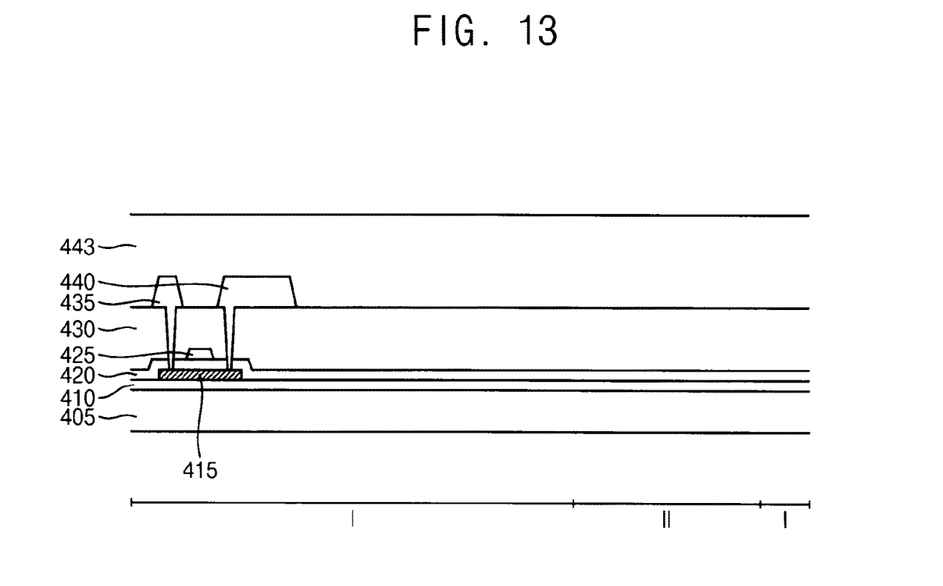

Referring to FIG. 13, a preliminary insulation layer 443 may be formed on the substrate 405 to cover the semiconductor device. The preliminary insulation layer 443 may be formed using silicon oxide, silicon nitride, silicon oxynitride, silicon carbon nitride, aluminum oxide, titanium oxide, tantalum oxide, zinc oxide, magnesium oxide, zirconium oxide, hafnium oxide, or the like. The preliminary insulation layer 443 may be obtained by any suitable process, including but not limited to a spin coating process, a printing process, a chemical vapor deposition process, an atomic layer deposition process, a plasma enhanced chemical vapor deposition process, a high density plasma-chemical vapor deposition process, or a vacuum evaporation process.

Figure 14:
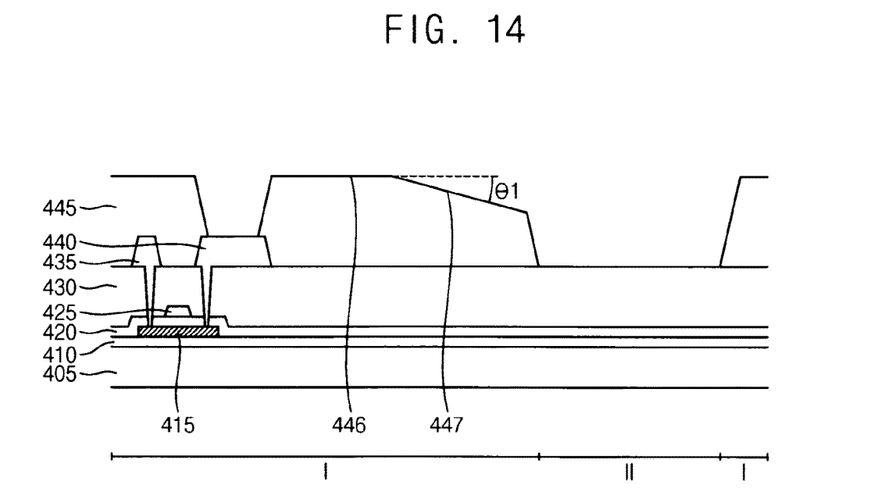

Referring to FIG. 14, the preliminary insulation layer 443 may be etched to form an insulation layer 445 having an inclined structure. For example, the preliminary insulation layer 443 may be anisotropically etched by a dry etching process. Examples of dry etching processes for forming the insulation layer 445 include, but are not limited to, an ion beam etching process, or a reactive ion etching process. In the formation of the insulation layer 445 having the inclined structure, a halftone mask or a halftone slit mask may be used to form the inclined structure of the insulation layer 445. Alternatively, a mask having mask patterns disposed by different distances may be used in the etching process. In this case, a portion of the preliminary insulation layer 443 exposed between mask patterns separated by a relative large distance may be more rapidly etched than a portion of the preliminary insulation layer 443 exposed between mask patterns separated by a relative small distance, so that the inclined structure may be formed on the insulation layer 445. As described above, a first portion 446 of an upper face of the insulation layer 445 may be substantially parallel to an upper surface of the substrate 405, and a second portion 447 of the upper face of the insulation layer 445 may be inclined by an inclination angle θ1 of about 30° to about 60° with respect to the upper surface of the substrate 405 (and the first portion 446 substantially parallel thereto).

Figure 15:
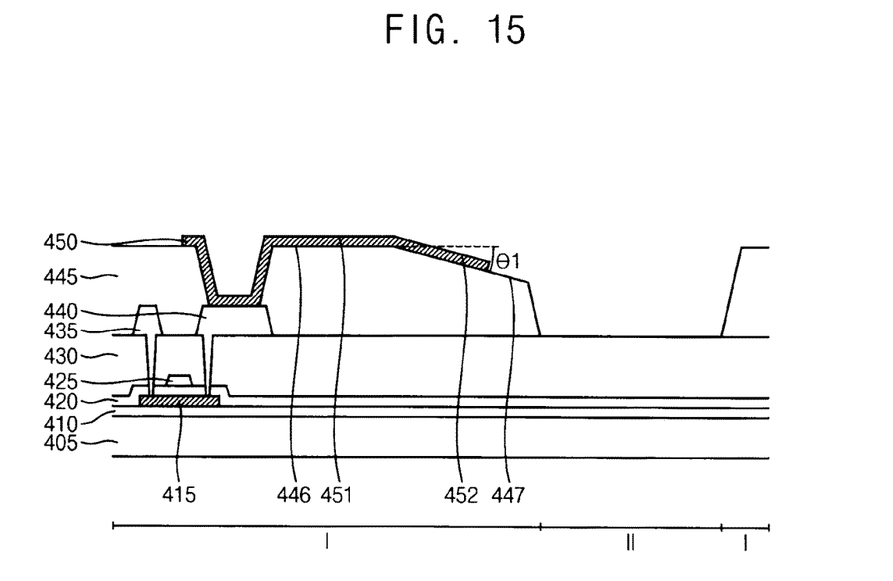

Referring to FIG. 15, a first electrode 450 may be formed on the insulation layer 445 having the inclined structure. The first electrode 450 may be formed using a material having a transmittance or a reflectivity depending on the emission type of the organic light emitting display device. The first electrode 450 may extend on the insulation layer 445 along the profile of the inclined structure so as to have a first portion 451 substantially parallel to an upper surface of the substrate 405, and a second portion 452 inclined the same as a second portion 447 of the upper face of the insulation layer 445.

Figure 16:
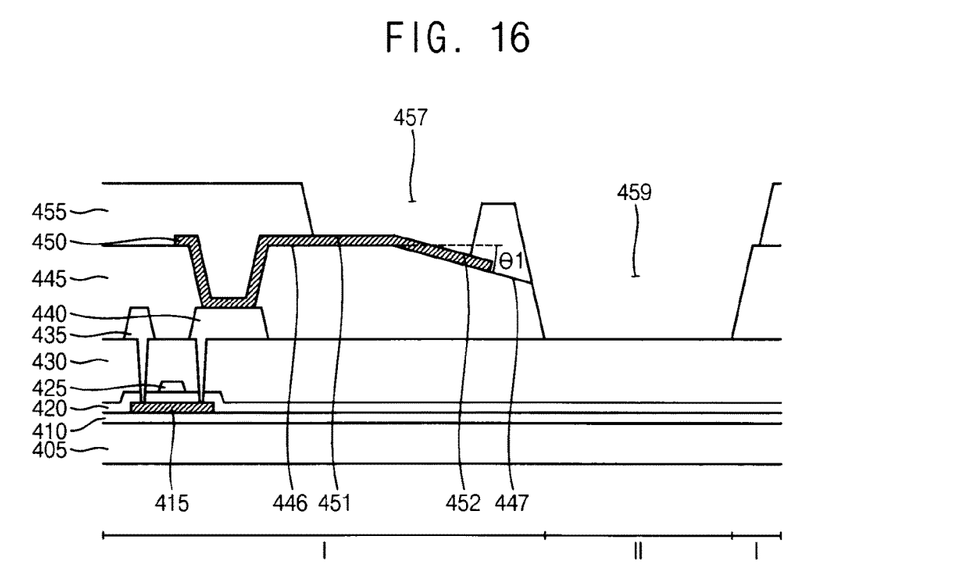

Referring to FIG. 16, a pixel defining layer 455 may be formed on the insulation layer 445 and the first electrode 450. The pixel defining layer 455 may be formed using an organic material having a relatively high transmittance, such as polyimide-based polymer, polyamide-based polymer, and the like. The pixel defining layer 455 may be partially etched to form a pixel opening 457 in the pixel region I and to form an opening 459 in the transparent region II. The pixel opening 457 may partially expose the first electrode 450, and the opening 459 may pass through the pixel defining layer 455 and the insulation layer 445 to partially expose the insulating interlayer 430. In exemplary embodiments, the openings 459 of adjacent transparent regions II may be substantially symmetrically formed, so that the area of the transparent region II of the organic light emitting display device may be increased.

Figure 17:
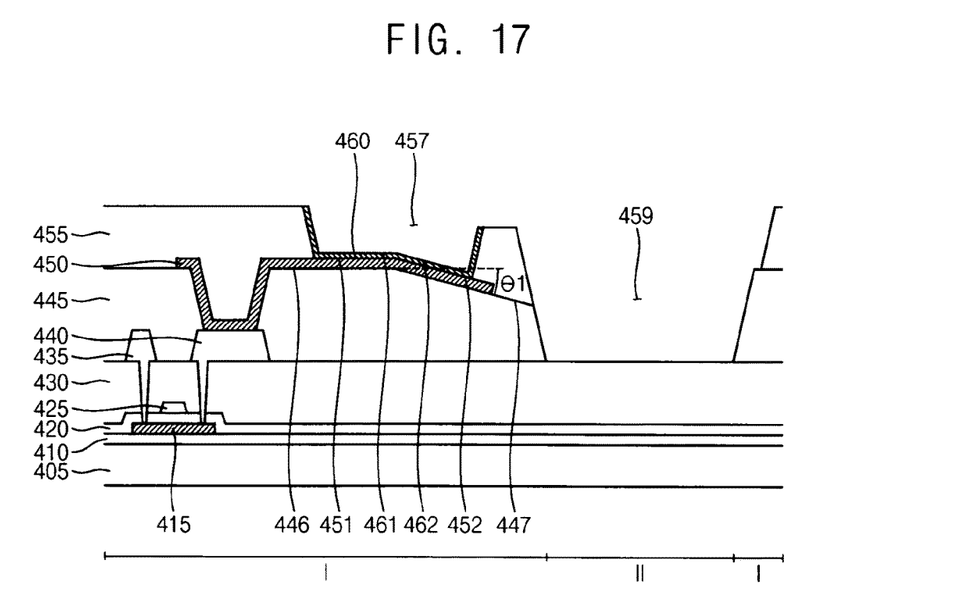

Referring to FIG. 17, an organic light emitting layer 460 may be formed on the exposed first electrode 450 and the pixel defining layer 455. As described above, some of the light generated from the organic light emitting layer 460 may be directed toward the transparent region II by the inclined structure of the insulation layer 445, and other light emitted from the organic light emitting layer 460 may be directed toward the front of the organic light emitting display device. Accordingly, the organic light emitting display device may increase the resolution of the image by utilizing the light directed into the transparent region II.

Figure 18:
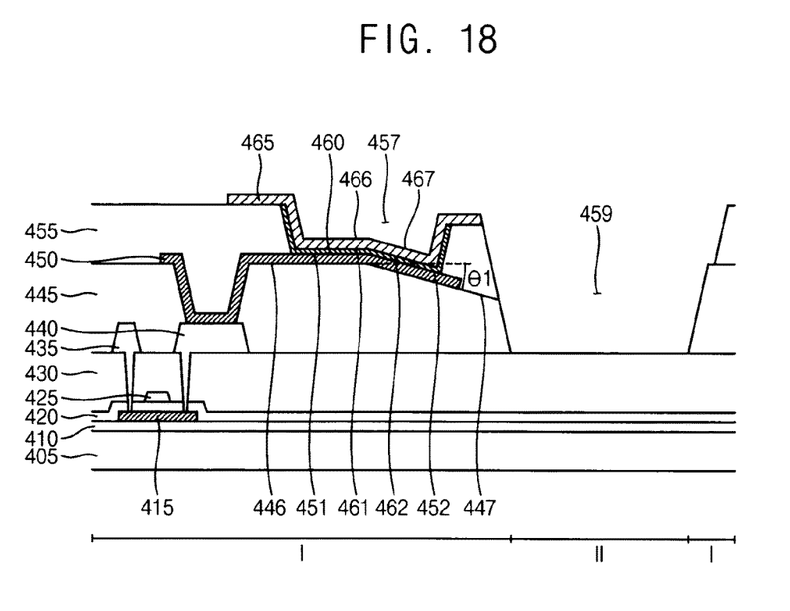

Referring to FIG. 18, a second electrode 465 may be formed on the organic light emitting layer 460 and the pixel defining layer 455. The second electrode 465 may be formed using a material substantially the same as or similar to that of the first electrode 450. A portion 466 of the second electrode 465 may be substantially parallel to the substrate 405 and another portion 467 may be inclined about the substrate 405 as described above. Further, portions of the second electrode 465 formed on the sidewall of the pixel opening 457 may have inclination angles different from each other.

According to exemplary embodiments, an organic light emitting display device may include the openings of the transparent regions of the adjacent pixels substantially symmetrically disposed each other. As such, the entire area of transparent regions may be increased relative to those in a conventional organic light emitting display device. Moreover, because some of the light emitted from the organic light emitting layer may be directed toward the transparent region by the insulation layer having the inclined structure, the resolution of the image displayed by the organic light emitting display device may be improved.

The organic light emitting display device according to exemplary embodiments may be employed in various electronic apparatuses, for example, a display apparatus having a relatively large screen, a smart window, a transparent tablet personal computer, a wearable display device, a display apparatus for an automobile, a vessel or an aircraft, or the like.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display device comprising:
   a substrate comprising a pixel region and a transparent region;
   a semiconductor device disposed on the substrate;
   an insulation layer disposed on the semiconductor device, the insulation layer comprising an inclined structure;
   a first electrode disposed on the insulation layer, the first electrode having a first portion in parallel to the substrate and a second portion extending from a peripheral edge of the first portion and inclined relative to the substrate;
   a pixel defining layer disposed on the insulation layer and the first electrode, the pixel defining layer comprising a pixel opening exposing the first electrode positioned on the inclined structure;
   an organic light emitting layer disposed on the exposed first electrode and the pixel defining layer; and
   a second electrode disposed on the organic light emitting layer and the pixel defining layer,
   wherein light generated from the organic light emitting layer is directed in different directions by the inclined structure, and the organic light emitting layer contacts the first and the second portions of the first electrode.

2. The organic light emitting display device of claim 1, wherein the inclined structure includes an upper face of the insulation layer having portions inclined by different inclination angles relative to the substrate.

3. The organic light emitting display device of claim 2, wherein a first portion of the upper face of the insulation layer is parallel to an upper surface of the substrate, and a second portion of the upper face of the insulation layer is inclined toward the upper surface of the substrate.

4. The organic light emitting display device of claim 3, wherein the second portion of the upper face of the insulation layer has an inclination angle of about 30° to about 60° with respect to the upper surface of the substrate.

5. The organic light emitting display device of claim 4, wherein the first portion of the first electrode on the first portion of the upper face of the insulation layer is parallel to the upper surface of the substrate, and the second portion of the first electrode on the second portion of the upper face of the insulation layer has an inclination angle substantially identical to the inclination angle of the second portion of the upper face.

6. The organic light emitting display device of claim 5, wherein a first portion of the organic light emitting layer on the first portion of the first electrode is parallel to the upper surface of the substrate, and a second portion of the organic light emitting layer on the second portion of the first electrode has an inclination angle substantially identical to the inclination angle of the second portion of the first electrode.

7. The organic light emitting display device of claim 3, wherein the organic light emitting layer extends onto a sidewall of the pixel opening.

8. The organic light emitting display device of claim 3, wherein the organic light emitting display device is a top emission type.

9. The organic light emitting display device of claim 2, wherein a first portion of the upper face of the insulation layer is parallel to an upper surface of the substrate, and a second portion of the upper face of the insulation layer is inclined away from the upper surface of the substrate.

10. The organic light emitting display device of claim 9, wherein the second portion of the upper face of the insulation layer has an inclination angle of about 120° to about 150° with respect to the upper surface of the substrate.

11. The organic light emitting display device of claim 9, wherein the organic light emitting display device is a bottom emission type.

12. The organic light emitting display device of claim 1, further comprising an opening provided through the insulation layer and the pixel defining layer in the transparent region, wherein openings of adjacent pixels are symmetrically arranged each other.

13. The organic light emitting display device of claim 1, wherein a first portion of a sidewall of the pixel opening has an inclination angle greater than an inclination angle of a second portion of the sidewall of the pixel opening.

14. The organic light emitting display device of claim 13, wherein a ratio between the inclination angle of the first portion of the sidewall and the inclination angle of the second portion of the sidewall is in a range of about 1.0:0.5 to about 1.0:1.7.

15. An organic light emitting display device comprising:
a substrate comprising a pixel region and a transparent region;
a semiconductor device disposed on the substrate;
an insulation layer disposed on the semiconductor device, the insulation layer comprising an inclined structure;
a first electrode disposed on the insulation layer;
a pixel defining layer disposed on the insulation layer and the first electrode,
the pixel defining layer comprising a pixel opening exposing the first electrode positioned on the inclined structure;
an organic light emitting layer disposed on the exposed first electrode and the pixel defining layer; and
a second electrode disposed on the organic light emitting layer and the pixel defining layer,
wherein a first portion of an upper face of the insulation layer is parallel to an upper surface of the substrate, and a second portion of the upper face of the insulation layer extends from a peripheral edge of the first portion of the upper face of the insulation layer and is inclined to direct light in a direction of the transparent region, and
wherein light generated from the organic light emitting layer is directed in different directions by the inclined structure.

16. The organic light emitting device of claim 15, wherein transparent regions of adjacent pixels are symmetrically arranged.

* * * * *